United States Patent
Chen et al.

(10) Patent No.: US 11,393,959 B2
(45) Date of Patent: Jul. 19, 2022

(54) MICRO LIGHT-EMITTING DIODE DEVICE

(71) Applicant: PlayNitride Display Co., Ltd., MiaoLi County (TW)

(72) Inventors: Pei-Hsin Chen, MiaoLi County (TW); Yi-Chun Shih, MiaoLi County (TW); Chih-Ling Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 16/708,443

(22) Filed: Dec. 10, 2019

(65) Prior Publication Data

US 2021/0126170 A1  Apr. 29, 2021

(30) Foreign Application Priority Data

Oct. 28, 2019  (TW) .................................. 108138796

(51) Int. Cl.
*H01L 33/54* (2010.01)
*H01L 33/58* (2010.01)

(52) U.S. Cl.
CPC .............. *H01L 33/54* (2013.01); *H01L 33/58* (2013.01)

(58) Field of Classification Search
CPC ................................. H01L 33/54; H01L 33/58
See application file for complete search history.

(56) References Cited

U.S. PATENT DOCUMENTS

| | | | | |
|---|---|---|---|---|
| 2002/0187574 A1* | 12/2002 | Moon | ................. | H01L 27/1255 438/30 |
| 2003/0044552 A1* | 3/2003 | Komada | ................. | B32B 27/08 428/35.7 |
| 2008/0280383 A1* | 11/2008 | Wang | ...................... | H01L 22/12 438/17 |
| 2012/0228580 A1* | 9/2012 | Wang | .................... | H01L 27/156 257/13 |
| 2013/0119424 A1 | 5/2013 | Kang et al. | | |
| 2019/0172761 A1* | 6/2019 | Guo | ........................ | H01L 33/62 |

(Continued)

FOREIGN PATENT DOCUMENTS

CN  101305477  11/2008
CN  102683529  9/2012

(Continued)

OTHER PUBLICATIONS

"Office Action of Taiwan Counterpart Application", dated Jul. 27, 2020, p. 1-p. 6.

(Continued)

*Primary Examiner* — Jay C Chang
*Assistant Examiner* — Mikka Liu
(74) *Attorney, Agent, or Firm* — JCIPRNET

(57) ABSTRACT

A micro light-emitting diode device includes a substrate, a micro light-emitting diode, a first protection layer and a second protection layer. The micro light-emitting diode is disposed on the substrate. The first protection layer is disposed on a first portion of an outer side wall of the micro light-emitting diode and has a gap from the substrate. The second protection layer is at least disposed on a second portion of the outer side wall and is located in the gap between the first protection layer and the substrate. A height of the second protection layer on the substrate is less than or equal to a height of the micro light-emitting diode on the substrate.

12 Claims, 8 Drawing Sheets

(56) References Cited

U.S. PATENT DOCUMENTS

2019/0326330 A1   10/2019  Xia et al.
2020/0119244 A1*  4/2020  Kwon ................... H01L 27/156
2021/0400395 A1*  12/2021  Miyoshi ................ H04R 17/00

FOREIGN PATENT DOCUMENTS

| | | | |
|---|---|---|---|
| CN | 103928603 | | 7/2014 |
| CN | 106373895 | | 2/2017 |
| CN | 108011012 | | 5/2018 |
| CN | 108011012 A | * | 5/2018 |
| CN | 108288664 | | 7/2018 |
| CN | 108963051 | | 12/2018 |
| CN | 109873006 | | 6/2019 |
| CN | 209029405 | | 6/2019 |
| CN | 110088919 | | 8/2019 |
| TW | 201234664 | | 8/2012 |
| TW | 201626555 | | 7/2016 |
| TW | 201917911 | | 5/2019 |
| WO | 2019124684 | | 6/2019 |

OTHER PUBLICATIONS

"Office Action of China Counterpart Application", dated Jul. 23, 2021, p. 1-p. 7.
"Office Action of China Counterpart Application", dated Dec. 10, 2021, p. 1-p. 7.

* cited by examiner

MICRO LIGHT-EMITTING DIODE DEVICE

CROSS-REFERENCE TO RELATED APPLICATION

This application claims the priority benefit of Taiwan application serial no. 108138796, filed on Oct. 28, 2019. The entirety of the above-mentioned patent application is hereby incorporated by reference herein and made a part of this specification.

BACKGROUND

Technical Field

The disclosure relates to a micro light-emitting diode device, and particularly relates to a micro light-emitting diode device provided with protection layers.

Description of Related Art

With the advancement of the photoelectric technology, the volume of many photoelectric components is gradually miniaturized. In recent years, due to the breakthrough in the size of Light-Emitting Diodes (LEDs), the LEDs can be applied not only to the lighting technology but also to display panels. At present, a micro-LED display formed by arranging the LEDs in array is gaining increasing attention in the market. The micro-LED display belongs to an active LED display, and in addition to being more power-saving than an Organic Light-Emitting Diode (OLED) display, the micro-LED display has better contrast performance and is visible in the sunlight. Besides, since the micro-LED display is made of inorganic materials, the micro-LED display has better reliability and longer service life than the OLED display. How to provide better protection for micro-LEDs is the research object in this field.

SUMMARY

The disclosure provides a micro light-emitting diode device provided with protection layers.

The micro light-emitting diode device provided by the disclosure includes a substrate, a micro light-emitting diode, a first protection layer and a second protection layer. The micro light-emitting diode is disposed on the substrate. The first protection layer is disposed on a first portion of an outer side wall of the micro light-emitting diode and has a gap from the substrate. The second protection layer is at least disposed on a second portion of the outer side wall of the micro light-emitting diode and is located in the gap between the first protection layer and the substrate. A height of the second protection layer on the substrate is less than or equal to a height of the micro light-emitting diode on the substrate.

In an embodiment of the disclosure, the height of the second protection layer on the substrate is less than or equal to 0.5 time the height of the micro light-emitting diode on the substrate.

In an embodiment of the disclosure, a material of the first protection layer is different from a material of the second protection layer.

In an embodiment of the disclosure, a Young's modulus of the first protection layer is greater than a Young's modulus of the second protection layer.

In an embodiment of the disclosure, the micro light-emitting diode includes a light-emitting layer, and the height of the second protection layer on the substrate is less than a height of the light-emitting layer on the substrate.

In an embodiment of the disclosure, the second protection layer is a lightproof layer.

In an embodiment of the disclosure, a roughness of the first portion of the outer side wall of the micro light-emitting diode is less than a roughness of the second portion.

In an embodiment of the disclosure, the second protection layer is further disposed on a bottom surface of the micro light-emitting diode and between the micro light-emitting diode and the substrate.

In an embodiment of the disclosure, the second protection layer is provided with at least one hole in a portion corresponding to the bottom surface of the micro light-emitting diode, and the at least one hole occupies 10% to 90% of an area of the bottom surface of the micro light-emitting diode.

In an embodiment of the disclosure, a projection of the first protection layer on the substrate is less than a projection of the second protection layer on the substrate.

In an embodiment of the disclosure, a projection of the first protection layer on the substrate is greater than a projection of the second protection layer on the substrate.

In an embodiment of the disclosure, the second protection layer is a conductive layer.

In an embodiment of the disclosure, the second protection layer extends to at least a portion of the bottom surface of the micro light-emitting diode.

Based on the above, the first protection layer of the micro light-emitting diode device provided by the disclosure is disposed on the first portion of the outer side wall of the micro light-emitting diode, and the second protection layer is at least disposed on the second portion of the outer side wall of the micro light-emitting diode and is located in the gap between the first protection layer and the substrate, so that the micro light-emitting diode of the micro light-emitting diode device provided by the disclosure can be well protected.

DESCRIPTION OF THE EMBODIMENTS

A micro light-emitting diode described in a micro light-emitting diode device in the embodiments of the disclosure, as used herein, means that a light-emitting diode of which a size ranges from 1 micron to 100 microns. In some embodiments, the micro light-emitting diode may have a maximum width of one of 20 microns, 10 microns, or 5 microns. In some embodiments, the micro light-emitting diode may have a maximum height of one of less than 20 microns, 10 microns, or 5 microns. It should be understood that the embodiments of the disclosure are not necessarily limited thereto, and larger or smaller scales may be applied to aspects of some embodiments. A substrate may be, for example, a display substrate, a light-emitting substrate, a substrate having functional components such as thin film transistors or integrated circuits (ICs), or other types of circuit substrates, but is not limited thereto. Although some embodiments of the disclosure specifically describe a micro light-emitting diode including a p-n diode, it should be understood that the embodiments of the disclosure are not limited thereto. Other micro-semiconductor components may also be applied to some embodiments, including micro-semiconductor components capable of controlling execution of a predetermined electronic function (for example, diodes, transistors, and integrated circuits) or micro-semiconductor components having a photonic function (for example, laser diodes, and photodiodes). Microchips including circuits may also be applied to some of other embodiments of the disclosure, for example, microchips made of Si or SOI wafers and used for logic or memory applications, or microchips made of GaAs wafers and used for RF communication applications.

Figure 1:
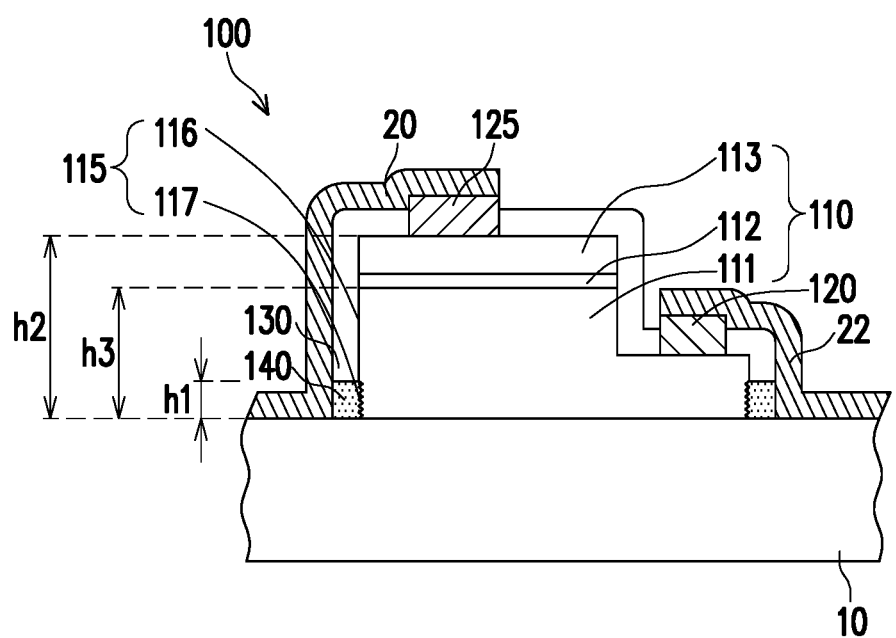
FIG. 1 is a cross-sectional view of a micro light-emitting diode device according to an embodiment of the disclosure.

FIG. 1 is a cross-sectional view of a micro light-emitting diode device according to an embodiment of the disclosure. Referring to FIG. 1, a micro light-emitting diode device 100 of the present embodiment may be a micro light-emitting diode display (micro LED display), and may include other components. These other components include (but are not limited to): a memory, a touch screen controller and a battery. In other implementations, the micro light-emitting diode display may be a television, a tablet computer, a telephone, a laptop computer, a computer monitor, a stand-alone terminal service desk, a digital camera, a handheld game console, a media display, an e-book display, a vehicle display, or a large-area electronic billboard display. The micro light-emitting diode device 100 includes a substrate 10, the substrate 10 is a circuit substrate, and the circuit substrate may be a Complementary Metal-Oxide-Semiconductor (CMOS) substrate, a Liquid Crystal on Silicon (LCOS) substrate, a Thin Film Transistor (TFT) substrate, or other substrates having a working circuit. The substrate 10 may also be a flexible substrate, and the material thereof includes polyester resin (PET), polyethylene naphthalate (PEN), or polyimide (PI).

The micro light-emitting diode device 100 also includes a micro light-emitting diode 110, a first protection layer 130 and a second protection layer 140. The micro light-emitting diode 110 is disposed on the substrate 10 and is electrically connected to the substrate 10.

In the present embodiment, the micro light-emitting diode 110 includes a first type semiconductor layer 111 (such as an N type semiconductor layer), a light-emitting layer 112 and a second type semiconductor layer 113 (such as a P type semiconductor layer) stacked sequentially. A thickness of an epitaxial structure of the micro light-emitting diode 110 is preferably from 1 micron to 6 microns, and a too thick or too thin epitaxial structure will affect the yield of subsequent processes. A thickness of the first type semiconductor layer 111 may be greater than a thickness of the second type semiconductor layer 113, wherein the thickness of the first type semiconductor layer 111 is between 1 micron and 5 microns, a thickness of the light-emitting layer 112 is between 0.1 micron and 1 micron, and the thickness of the second type semiconductor layer 113 is between 0.1 micron and 0.5 micron. However, the disclosure is not limited thereto.

Furthermore, in the present embodiment, the micro light-emitting diode 110 is, for example, a horizontal light-emitting diode. A length and a width of the first type semiconductor layer 111 are greater than a length and a width of the second type semiconductor layer 113. In other words, the micro light-emitting diode 110 is of a ladder structure as viewed in a cross section. Herein, a maximum width difference between the first type semiconductor layer 111 and the second type semiconductor layer 113 is between 0 micron and 5 microns, and the first type semiconductor layer 111 and the second type semiconductor layer 113 may be elastically applied to the subsequent design.

The micro light-emitting diode device 100 also includes a first type electrode 120 and a second type electrode 125 which are respectively in contact with and are electrically connected to the first type semiconductor layer 111 and the second type semiconductor layer 113. And the first type electrode 120 and the second type electrode 125 are formed by high-work-function metals (such as platinum, nickel, titanium, gold, chromium, alloys thereof and a combination of the above materials), metal oxides (such as indium tin oxide and zinc oxide) or conductive non-metallic materials, such as conductive polymers, graphite, graphene and black phosphorus.

The first protection layer 130 is disposed on a first portion 116 of an outer side wall 115 of the micro light-emitting diode 110 and has a gap (height h1) from the substrate 10. The second protection layer 140 is at least disposed on a second portion 117 of the outer side wall 115 of the micro light-emitting diode 110 and is located in the gap between the first protection layer 130 and the substrate 10. In the present embodiment, because the micro light-emitting diode 110 is the horizontal light-emitting diode, the first type electrode 120 and the second type electrode 125 are located on a top surface of the micro light-emitting diode 110, and the second portion 117, disposed on the outer side wall 115, of the second protection layer 140 is close to a bottom surface of the micro light-emitting diode 110 and away from the first type electrode 120 and the second type electrode 125. Furthermore, in the present embodiment, a thickness of the first protection layer 130 is substantially equal to a thickness of the second protection layer 140, but is not limited thereto. The micro light-emitting diode 110 is designed to have the first protection layer 130 and the second protection layer 140, so that circuits 22 and 20 connected to the first type electrode 120 and the second type electrode 125 can be distributed along outer edges of the first protection layer 130 and the second protection layer 140 and lowered onto the substrate 10, and the micro light-emitting diode 10 can be electrically connected to the substrate 10 through the circuits 20 and 22.

Furthermore, in the present embodiment, a roughness of the first portion 116 of the outer side wall 115 of the micro light-emitting diode 110 is less than a roughness of the second portion 117. Therefore, the second portion 117 of the outer side wall 115 of the micro light-emitting diode 110 has greater roughness. The greater roughness also provides a better grasping force for the second protection layer 140.

Furthermore, because the micro light-emitting diode 110 is heated in a process of being bonded to the substrate 10, the greater roughness of the second portion 117 of the outer side wall 115 of the micro light-emitting diode 110 can also provide more space for filling the softened second protection layer 140 so as to improve a buffering effect.

It is worth mentioning that a material of the first protection layer 130 is different from a material of the second protection layer 140. In the present embodiment, the material of the first protection layer 130 may be an inorganic material, such as silicon dioxide. The material of the second protection layer 140 may be an organic material, such as an organic polymer layer, a photosensitive layer or a heat sensitive layer. More specifically, the material of the second protection layer 140 includes epoxy resin. Of course, in an embodiment, the second protection layer 140 may also be a lightproof layer, for example, doped with reflective particles or including a black photoresist layer to help forward light emission. Furthermore, in an embodiment, the first protection layer 130 may be, for example, a light transmissive layer, and the second protection layer 140 may be, for example, a lightproof layer to control the amplitude of lateral light emission. Of course, the material of the first protection layer 130 and the material of the second protection layer 140 are not limited thereto.

In the present embodiment, a Young's modulus of the first protection layer 130 is greater than a Young's modulus of the second protection layer 140, so that the first protection layer 130 can provide better protection for the micro light-emitting diode 110, and the second protection layer 140 can provide better buffering so as to reduce the probability of damage of the micro light-emitting diode 110 in a bonding process.

It should be noted that in order to make the micro light-emitting diode device 100 still have protection of certain strength, a height h1 of the second protection layer 140 on the substrate 10 is less than or equal to 0.5 time a height h2 of the micro light-emitting diode 110 on the substrate 10 so as to balance the buffering effect with the protection strength. More than 0.5 time will cause insufficient protection of the first protection layer 130. Furthermore, in the present embodiment, the height h1 of the second protection layer 140 on the substrate 10 is less than a height h3 of the light-emitting layer 112 on the substrate 10 so as to avoid influence on lateral light emission.

Figure 2A:
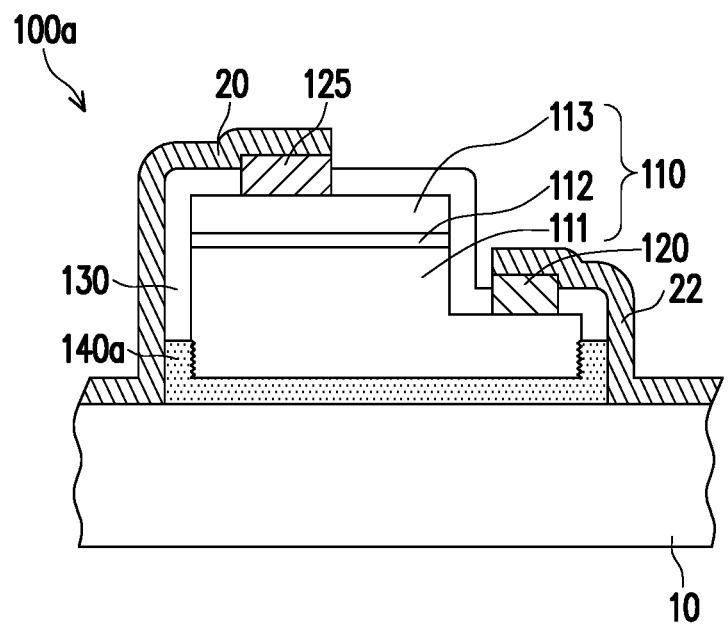
FIG. 2A is a cross-sectional view of a micro light-emitting diode device according to another embodiment of the disclosure.
Figure 2B:
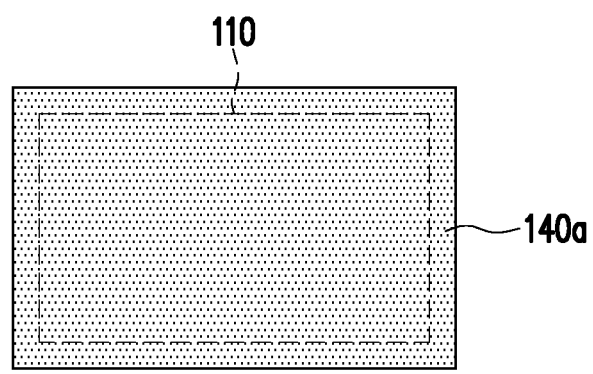
FIG. 2B is a bottom view after a substrate in FIG. 2A is hidden.

FIG. 2A is a cross-sectional view of a micro light-emitting diode device according to another embodiment of the disclosure. FIG. 2B is a bottom view after a substrate in FIG. 2A is hidden. Referring to FIG. 2A and FIG. 2B, the main difference between a micro light-emitting diode device 100a in FIG. 2A and the micro light-emitting diode device 100 in FIG. 1 is as follows: in the present embodiment, a second protection layer 140a is further disposed on a bottom surface of the micro light-emitting diode 110 and between the micro light-emitting diode 110 and the substrate 10 to provide a better buffering effect, thereby reducing the probability that the micro light-emitting diode device 100a is damaged by the pressure in a process of bonding the micro light-emitting diode device 100a to the substrate 10.

Figure 3A:
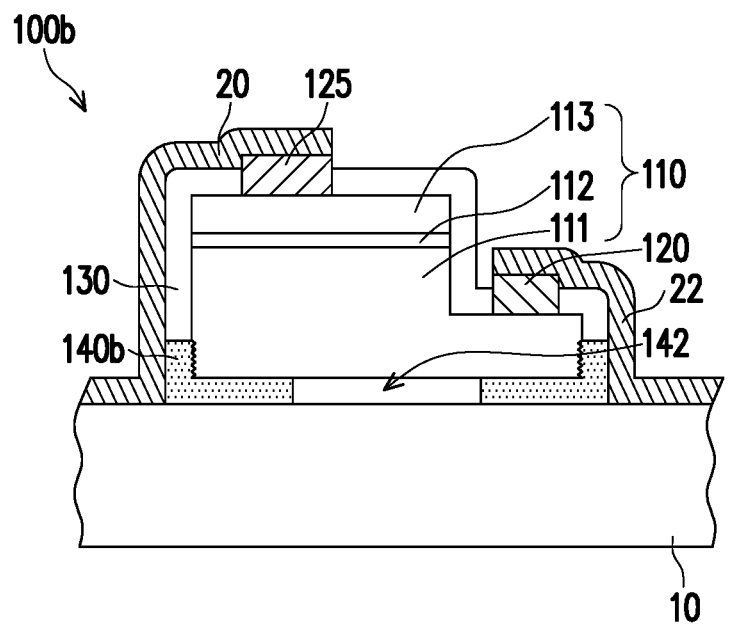
FIG. 3A is a cross-sectional view of a micro light-emitting diode device according to another embodiment of the disclosure.
Figure 3B:
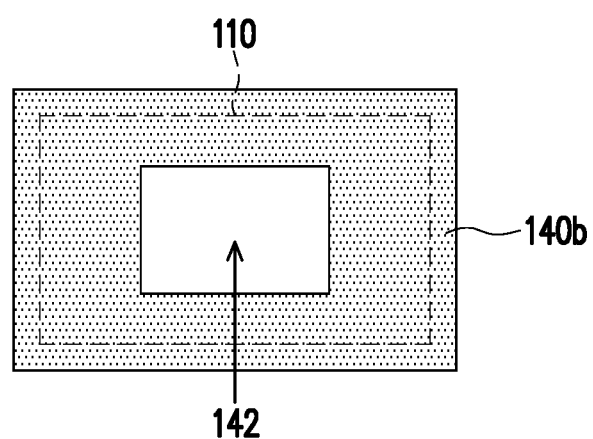
FIG. 3B is a bottom view after a substrate in FIG. 3A is hidden.

FIG. 3A is a cross-sectional view of a micro light-emitting diode device according to another embodiment of the disclosure. FIG. 3B is a bottom view after a substrate in FIG. 3A is hidden. Referring to FIG. 3A and FIG. 3B, the main difference between a micro light-emitting diode device 100b in FIG. 3A and the micro light-emitting diode device 100a in FIG. 2A is as follows: in the present embodiment, a second protection layer 140b is provided with a hole 142 in a portion corresponding to the bottom surface of the micro light-emitting diode 110, and the hole 142 occupies 10% to 90%, for example, 30% to 60% of an area of the bottom surface of the micro light-emitting diode 110. In the present embodiment, the hole 142 formed in the second protection layer 140b can reduce the probability that the micro light-emitting diode device 100b is deformed and cracked due to thermal expansion and cold contraction caused by temperature change. Specifically, the hole 142 may be an air hole. In an embodiment not shown, the hole may also be filled with a material having a thermal expansion coefficient less than that of the second protection layer so as to increase the tolerance of deformation.

Figure 4A:
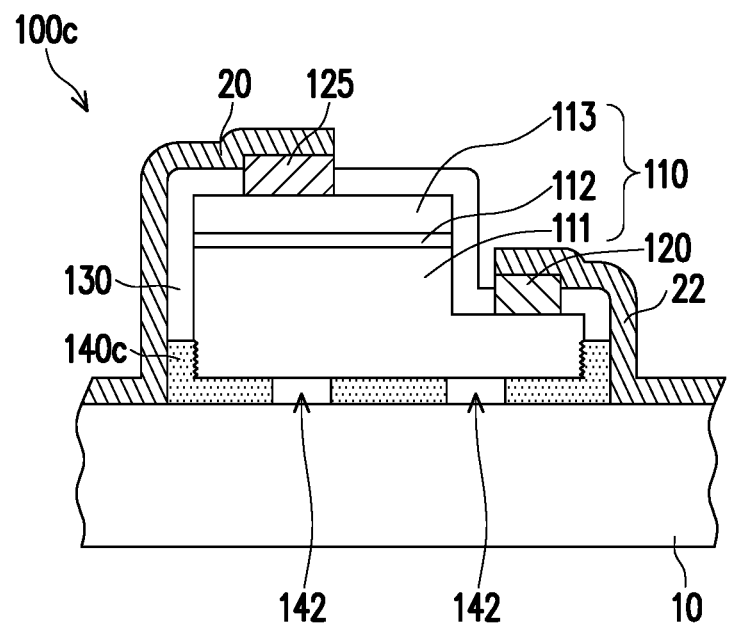
FIG. 4A is a cross-sectional view of a micro light-emitting diode device according to another embodiment of the disclosure.
Figure 4B:
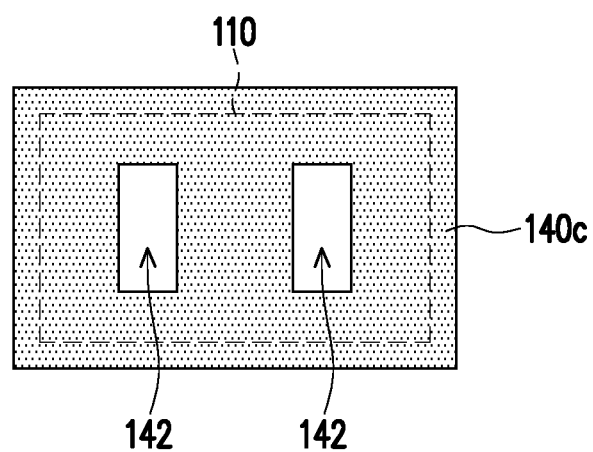
FIG. 4B is a bottom view after a substrate in FIG. 4A is hidden.

FIG. 4A is a cross-sectional view of a micro light-emitting diode device according to another embodiment of the disclosure. FIG. 4B is a bottom view after a substrate in FIG. 4A is hidden. Referring to FIG. 4A and FIG. 4B, the main difference between a micro light-emitting diode device 100c in FIG. 4A and the micro light-emitting diode device 100b in FIG. 3A is as follows: in the present embodiment, a second protection layer 140c is provided with a plurality of holes 142 in a portion corresponding to the bottom surface of the micro light-emitting diode 110. Herein, two holes are formed but are not limited thereto. In an embodiment, the holes 142 may be randomly arranged or patterned in an array arrangement. A designer can adjust the number and positions of the holes 142 as needed to provide a special buffering effect in response to temperature change or in a specific position.

Figure 5:
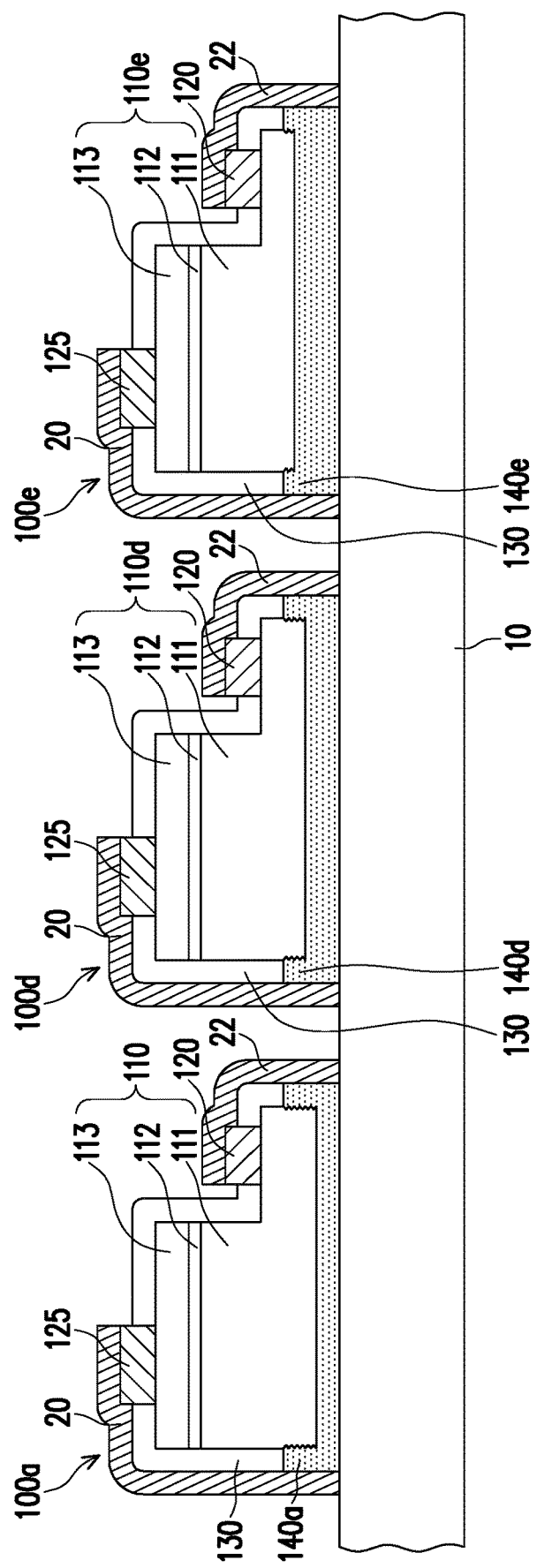
FIG. 5 is a cross-sectional view of a plurality of micro light-emitting diode devices according to a plurality of embodiments of the disclosure.

FIG. 5 is a cross-sectional view of a plurality of micro light-emitting diode devices according to a plurality of embodiments of the disclosure. Referring to FIG. 5, in the present embodiment, a micro light-emitting diode device 100a may, for example, include a micro light-emitting diode 110 capable of emitting green light, a micro light-emitting diode device 100d may include a micro light-emitting diode 110d capable of emitting blue light, and a micro light-emitting diode device 100e may, for example, include a micro light-emitting diode 110e capable of emitting red light. Because these micro light-emitting diodes 110, 110d and 110e have different heights, in the present embodiment, these micro light-emitting diode devices 100a, 100d and 100e may have the same height on a substrate 10 through second protection layers 140a, 140d and 140e having different thicknesses. In other words, the designer can adjust the thicknesses of the second protection layers 140a, 140d and 140e according to the height requirement to control light emission.

Figure 6:
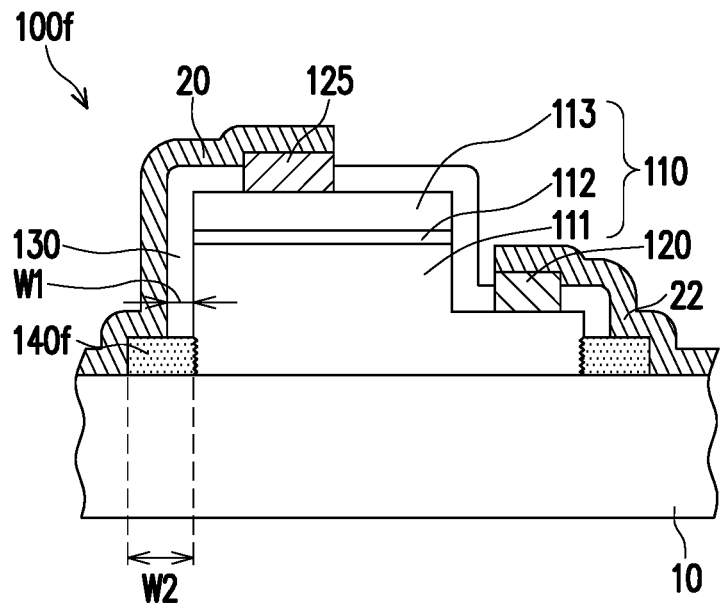
FIG. 6 is a cross-sectional view of a micro light-emitting diode device according to another embodiment of the disclosure.

FIG. 6 is a cross-sectional view of a micro light-emitting diode device according to another embodiment of the disclosure. Referring to FIG. 6, the main difference between a micro light-emitting diode device 100*f* in FIG. 6 and the micro light-emitting diode device 100 in FIG. 1 is as follows: in the present embodiment, the projection of the first protection layer 130 on the substrate 10 is less than a projection of a second protection layer 140*f* on the substrate 10. In other words, a thickness W1 of the first protection layer 130 is less than a thickness W2 of the second protection layer 140*f*. Such a design can enable circuits 20 and 22 to be slowly lowered along the outer edges of the first protection layer 130 and the second protection layer 140*f*. In other words, the circuits 20 and 22 can climb to the outer edges of the first protection layer 130 and the second protection layer 140*f* more slowly, and a buffering effect can be provided for the circuits 20 and 22. Preferably, the thickness W2 of the second protection layer 140*f* is greater than or equal to twice the thickness W1 of the first protection layer 130 to provide a better buffering effect.

Figure 7:
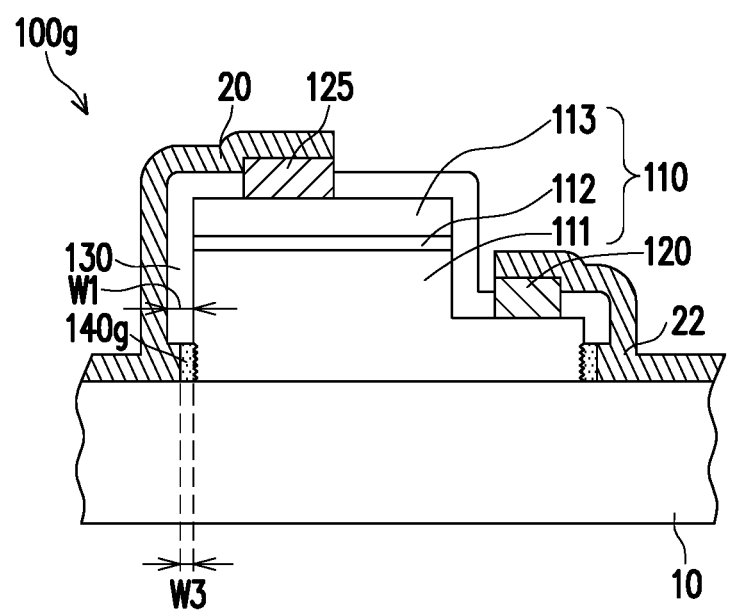
FIG. 7 is a cross-sectional view of a micro light-emitting diode device according to another embodiment of the disclosure.

FIG. 7 is a cross-sectional view of a micro light-emitting diode device according to another embodiment of the disclosure. Referring to FIG. 7, the main difference between a micro light-emitting diode device 100*g* in FIG. 7 and the micro light-emitting diode device 100 in FIG. 1 is as follows: in the present embodiment, the projection of the first protection layer 130 on the substrate 10 is greater than a projection of a second protection layer 140*g* on the substrate 10. In other words, the thickness W1 of the first protection layer 130 is greater than a thickness W3 of the second protection layer 140*g*. The second protection layer 140*g* has a smaller thickness W3 to allow more space to avoid interference with components or circuits on the substrate 10. Preferably, the thickness W1 of the first protection layer 130 may be greater than or equal to twice the thickness W3 of the second protection layer 140*g*.

Figure 8:
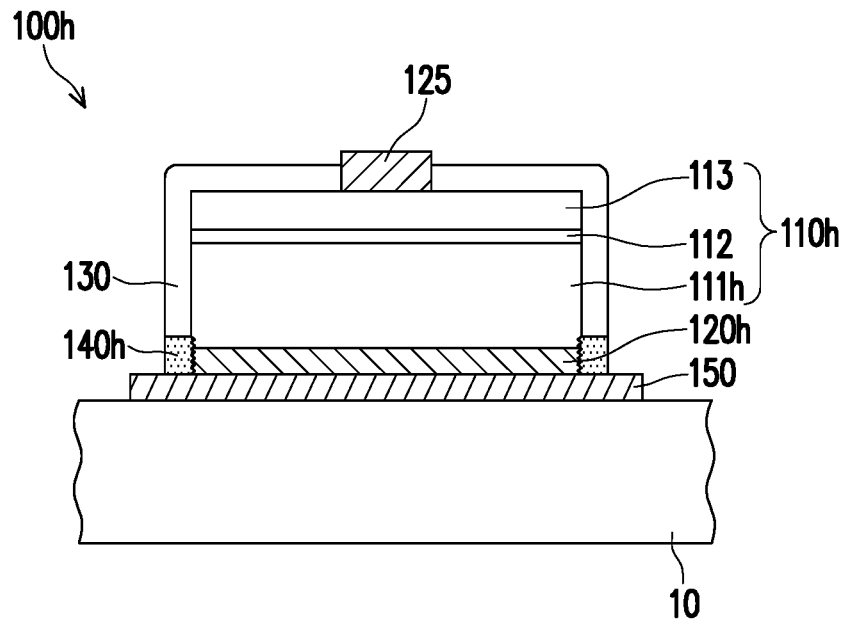
FIG. 8 is a cross-sectional view of a micro light-emitting diode device according to another embodiment of the disclosure.

FIG. 8 is a cross-sectional view of a micro light-emitting diode device according to another embodiment of the disclosure. Referring to FIG. 8, the main difference between a micro light-emitting diode device 100*h* in FIG. 8 and the micro light-emitting diode device 100 in FIG. 1 is as follows: in the present embodiment, the micro light-emitting diode 110*h* is a vertical micro light-emitting diode, and the micro light-emitting diode 110*h* includes a first type electrode 120*h* and a second type electrode 125 located at two opposite sides. The first type electrode 120*h* is located on a bottom surface of the micro light-emitting diode 110*h*, and the second type electrode 125 is located on a top surface of the micro light-emitting diode 110*h*. The micro light-emitting diode device 100*h* further includes a conductive bonding layer 150 disposed between the first type electrode 120*h* of the micro light-emitting diode 110*h* and the substrate 10. In the present embodiment, a second protection layer 140*h* may be insulated. The micro light-emitting diode 110*h* is connected to the conductive bonding layer 150 through the first type electrode 120*h* to conduct circuits on the substrate 10.

Of course, in other embodiments, the second protection layer 140*h* may be a conductive layer, therefore, the first type electrode 120*h* may be omitted, and the second protection layer 140*h* on the outer side wall is directly connected to the conductive bonding layer 150 to conduct the circuits on the substrate 10.

Figure 9A:
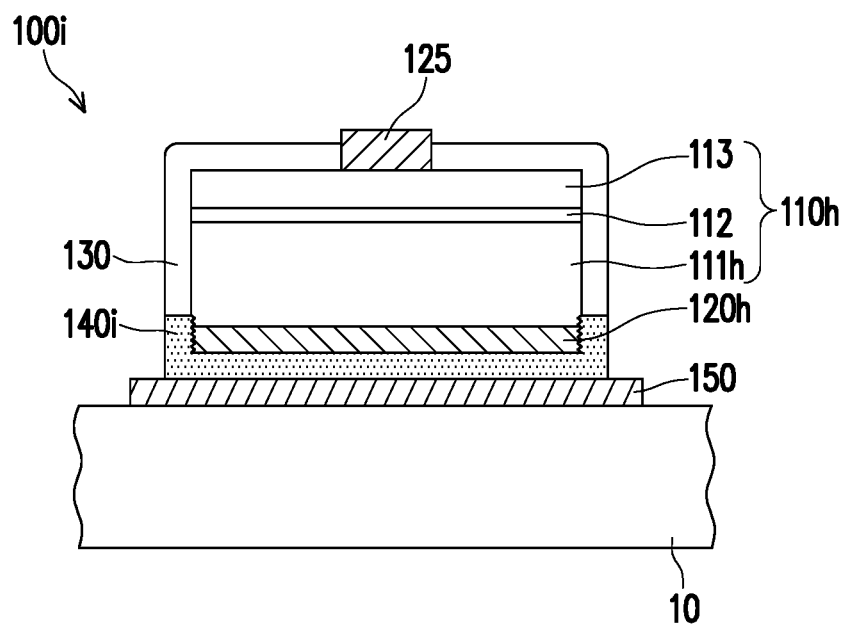
FIG. 9A is a cross-sectional view of a micro light-emitting diode device according to another embodiment of the disclosure.
Figure 9B:
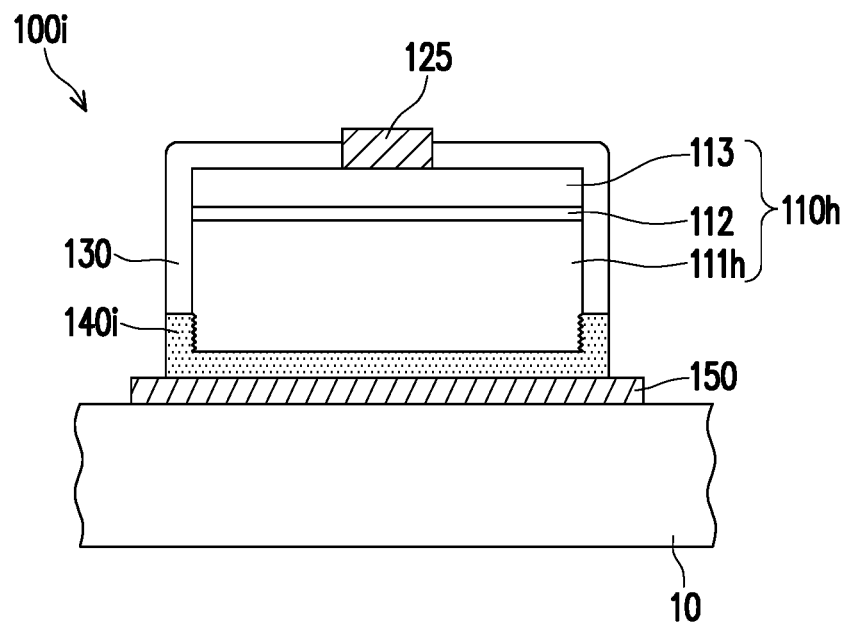
FIG. 9B is a cross-sectional view of a micro light-emitting diode device according to another embodiment of the disclosure.

FIG. 9A is a cross-sectional view of a micro light-emitting diode device according to another embodiment of the disclosure. Referring to FIG. 9A, the main difference between a micro light-emitting diode device 100*i* in FIG. 9A and the micro light-emitting diode device 100*h* in FIG. 8 is as follows: in the present embodiment, a second protection layer 140*i* is a conductive layer, and the second protection layer 140*i* extends to at least a portion of the bottom surface of the micro light-emitting diode 110*h* to be connected to the first type electrode 120*h*. The conductive bonding layer 150 is disposed between the second protection layer 140*i* and the substrate 10. The micro light-emitting diode 110*i* conducts circuits on the substrate 10 through the first type electrode 120*h*, the second protection layer 140*h* and the conductive bonding layer 150. In other words, in an embodiment, the second protection layer 140*i* and the first type electrode 120*h* may be made of the same material and formed in the same process, but the relationship between the second protection layer 140*i* and the first type electrode 120*h* is not limited thereto. Of course, in other embodiments, as shown in FIG. 9B, the first type electrode 120*h* may be omitted, and the second protection layer 140*i* is directly connected to the conductive bonding layer 150 to conduct circuits on the substrate 10, thereby increasing the process efficiency. Specifically, in an embodiment not shown, a second protection layer is provided with at least one hole in a portion corresponding to a bottom surface of a micro light-emitting diode, and the hole can provide a process tolerance for deformation of the second protection layer and the conductive bonding layer due to heating and pressurizing processes when the conductive bonding layer is bonded to the substrate.

Figure 10:
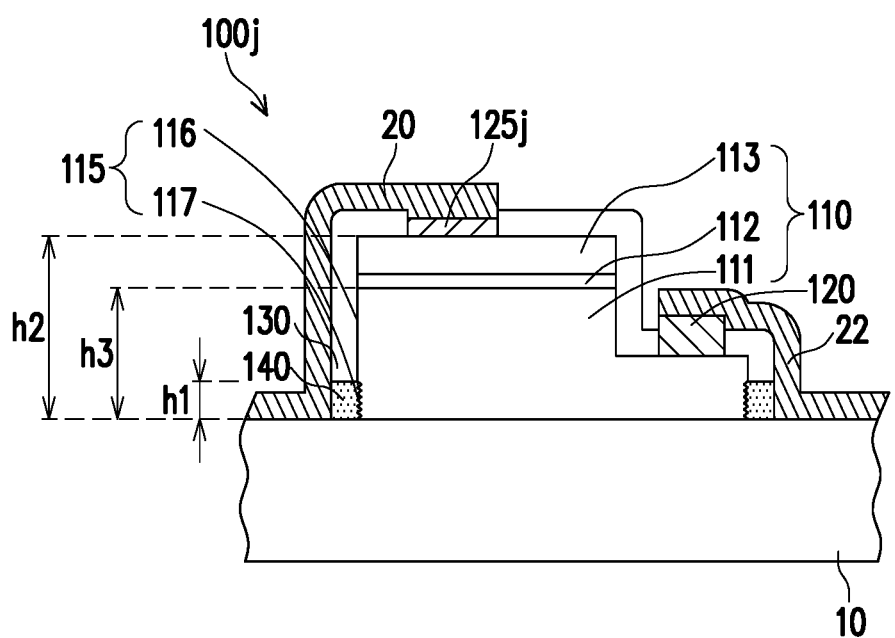
FIG. 10 is a cross-sectional view of a micro light-emitting diode device according to another embodiment of the disclosure.

FIG. 10 is a cross-sectional view of a micro light-emitting diode device according to another embodiment of the disclosure. Referring to FIG. 10, the main difference between a micro light-emitting diode device 100*j* in FIG. 10 and the micro light-emitting diode device 100 in FIG. 1 is as follows: in the present embodiment, a second type electrode 125*j* is lower than a surface of the first protection layer 130 and is disposed in the first protection layer 130, the circuit 20 may be disposed in a groove formed by the first protection layer 130 and the second type electrode 125*j*, and the circuit 20 is better electrically connected to the second type electrode 125*j*, thereby increasing the yield of the micro light-emitting diode device 100*j*.

Based on the above, the first protection layer of the micro light-emitting diode device provided by the disclosure is disposed on the first portion of the outer side wall of the micro light-emitting diode, the second protection layer is at least disposed on the second portion of the outer side wall of the micro light-emitting diode and is located in the gap between the first protection layer and the substrate, and the height of the second protection layer on the substrate is less than or equal to the height of the micro light-emitting diode on the substrate. Therefore, the micro light-emitting diode device provided by the disclosure can be well protected.

Furthermore, compared with general light-emitting diode technologies, the micro light-emitting diode is reduced from a millimeter level to a micron level, so that the micro light-emitting diode display can achieve a high resolution and reduce the power consumption of the display, and has the advantages of energy saving, simple structure, thinness and the like.

What is claimed is:
1. A micro light-emitting diode device, comprising:
 a substrate;
 a micro light-emitting diode, disposed on the substrate and including a light-emitting layer;
 a first protection layer, disposed on a first portion of an outer side wall of the micro light-emitting diode and having a gap from the substrate; and
 a second protection layer, at least disposed on a second portion of the outer side wall of the micro light-emitting diode and located in the gap between the first protection layer and the substrate, wherein a height of the second protection layer on the substrate is less than or equal to a height of the micro light-emitting diode on the substrate, wherein a projection of the first protection layer on the substrate overlaps a projection of the second protection layer on the substrate, the second protection layer contacts the first protection layer and the substrate, and a Young's modulus of the first protection layer is greater than a Young's modulus of the second protection layer, wherein the first protection layer is electrically insulating and covers the light-emitting layer.

2. The micro light-emitting diode device according to claim 1, wherein the height of the second protection layer on the substrate is less than or equal to 0.5 time the height of the micro light-emitting diode on the substrate.

3. The micro light-emitting diode device according to claim 1, wherein a material of the first protection layer is different from a material of the second protection layer.

4. The micro light-emitting diode device according to claim 1, wherein the height of the second protection layer on the substrate is less than a height of the light-emitting layer on the substrate.

5. The micro light-emitting diode device according to claim 1, wherein the second protection layer is a lightproof layer.

6. The micro light-emitting diode device according to claim 1, wherein a roughness of the first portion of the outer side wall of the micro light-emitting diode is less than a roughness of the second portion.

7. The micro light-emitting diode device according to claim 1, wherein the second protection layer is further disposed on a bottom surface of the micro light-emitting diode and between the micro light-emitting diode and the substrate.

8. The micro light-emitting diode device according to claim 7, wherein the second protection layer is provided with at least one hole in a portion corresponding to the bottom surface of the micro light-emitting diode, and the at least one hole occupies 10% to 90% of an area of the bottom surface of the micro light-emitting diode.

9. The micro light-emitting diode device according to claim 1, wherein the projection of the first protection layer on the substrate is less than the projection of the second protection layer on the substrate.

10. The micro light-emitting diode device according to claim 1, wherein the projection of the first protection layer on the substrate is greater than the projection of the second protection layer on the substrate.

11. The micro light-emitting diode device according to claim 1, wherein the second protection layer is a conductive layer.

12. The micro light-emitting diode device according to claim 11, wherein the second protection layer extends to at least a portion of a bottom surface of the micro light-emitting diode.

* * * * *